(12) United States Patent
Epee

(10) Patent No.: US 9,829,539 B2
(45) Date of Patent: Nov. 28, 2017

(54) SELF-TESTING GROUND FAULT CIRCUIT INTERRUPTER AND ASSOCIATED METHOD

(71) Applicant: EATON CORPORATION, Cleveland, OH (US)

(72) Inventor: Victor Doualla Epee, Pittsburgh, PA (US)

(73) Assignee: EATON CORPORATION, Cleveland, OH (US)

( * ) Notice: Subject to any disclaimer, the term of this patent is extended or adjusted under 35 U.S.C. 154(b) by 219 days.

(21) Appl. No.: 14/739,269

(22) Filed: Jun. 15, 2015

(65) Prior Publication Data

US 2016/0363627 A1   Dec. 15, 2016

(51) Int. Cl.
| | |
|---|---|
| *G01R 31/02* | (2006.01) |
| *G01R 31/14* | (2006.01) |
| *H02H 3/00* | (2006.01) |
| *H01H 73/00* | (2006.01) |
| *G01R 31/327* | (2006.01) |
| *H02H 3/16* | (2006.01) |
| *H02H 3/04* | (2006.01) |
| *H02H 3/33* | (2006.01) |

(52) U.S. Cl.
CPC ......... *G01R 31/3277* (2013.01); *H02H 3/044* (2013.01); *H02H 3/16* (2013.01); *H02H 3/335* (2013.01)

(58) Field of Classification Search
CPC ............................. H01H 73/00; G01R 31/3277
USPC ............................. 324/424, 509; 361/42, 115
See application file for complete search history.

(56) References Cited

U.S. PATENT DOCUMENTS

| | | | | |
|---|---|---|---|---|
| 5,729,145 A | * | 3/1998 | Blades | G01R 31/1272 324/522 |
| 6,191,589 B1 | * | 2/2001 | Clunn | G01R 15/183 324/127 |
| 6,466,029 B2 | * | 10/2002 | Stroth | G01R 31/3277 324/509 |
| 7,154,718 B1 | * | 12/2006 | Finlay, Sr. | H01H 83/04 361/42 |
| 7,440,250 B2 | * | 10/2008 | Terhorst | H01H 83/04 361/115 |
| 8,299,799 B2 | * | 10/2012 | Finlay, Sr. | H01H 83/04 324/424 |
| 2007/0297113 A1 | * | 12/2007 | Domitrovich | H02H 1/00 361/115 |

(Continued)

*Primary Examiner* — M'Baye Diao
(74) *Attorney, Agent, or Firm* — Eckert Seamans; Nathaniel Wilks; Grant Coffield

(57) ABSTRACT

A ground fault circuit interrupter (GFCI) including separable contacts, a ground fault detection circuit structured to detect a ground fault based and to output a trip signal in response to detecting the ground fault, a trip circuit structured to trip open the separable contacts in response to the trip signal, a test button structured to be actuated by a user, a test unit structured to sequentially perform a GFCI self-test sequence and a ground fault test sequence in response to actuation of the test button, wherein the test unit is structured to determine whether the GFCI passed the GFCI self-test sequence and to output in an alarm signal in response to determining that the GFCI failed the GFCI self-test sequence, and an indicator structured to receive the alarm signal and to provide a visual or audible indication in response to receiving the alarm signal.

16 Claims, 6 Drawing Sheets

(56) References Cited

U.S. PATENT DOCUMENTS

2012/0119918 A1* 5/2012 Williams ............... H02H 3/335
          340/664

* cited by examiner

SELF-TESTING GROUND FAULT CIRCUIT INTERRUPTER AND ASSOCIATED METHOD

BACKGROUND

Field

The disclosed concept relates generally to ground fault circuit interrupters (GFCI), and more particularly, to self-testing GFCIs. The disclosed concept also relates to methods of testing GFCIs.

Background Information

Electrical circuits generally employ one or more circuit interrupters configured to disable power to a load in response to an overcurrent condition, such as an overload condition or a relatively high level short circuit or fault condition. One such circuit interrupter is a ground fault circuit interrupter (GFCI). A GFCI is a device that disables an electric circuit when it detects that current is flowing along an unintended path, such as through water or through a person. GFCIs are often used to reduce the risk of electric shock. GFCIs are available in two types for permanent installation, the circuit breaker type that may be installed in a circuit breaker panel, and the receptacle type that may be installed in a normal electrical box.

A GFCI works by measuring difference between the current leaving the hot side of the power source and the current returning to the neutral side. If the measured currents are not equal (thus making the difference zero), this means that some of the current is flowing along an unintended path, and the GFCI shuts the power off. When the problem is corrected, the GFCI can manually be reset by pushing a reset button provided as part of the GFCI.

GFCIs are covered by Underwriters Laboratory (UL) Standard UL 943. The Standard UL 943 requires that GFCI devices include a built-in test circuit including a test button which allows a user to periodically manually test the device. When the test button is depressed, a simulated ground fault current is produced that causes the GFCI device to open if the device is operating properly. The device must then be manually reset (for receptacle types, this is done by pressing the rest button to return it to service; for circuit breaker types, this is done by switching the manual handle back to ON).

More recently, GFCIs have been developed that employ a self-test functionality that automatically performs a self-testing process periodically (e.g., without limitation, every 3 hours, every hour, or every minute). Such self-test GFCIs of the receptacle type typically include a status indicator, such as one or more LEDs, to visually indicate the current status of the device (i.e., operational or not operational) so that it can be replaced in the case of a failure. For breaker type GFCIs, the breaker will de-energize (trip) circuit if a self-test does not pass.

The self-testing process in GFCIs is more extensive than the simulated ground fault current that is produced when the user presses the test button. However, the user cannot manually initiate the self-testing procedure and can only assume that the self-testing process is being performed periodically. A fault in the timing logic of a GFCI could cause the GFCI to fail to periodically perform the self-testing process and the user would have no way to trigger the self-test process.

There is room for improvement in GFCIs, and in methods of testing GFCIs.

SUMMARY

These needs and others are met by embodiments of the disclosed concept, which are directed to a ground fault circuit interrupter (GFCI) including a test button and a test unit structured to sequentially perform a GFCI self-test sequence and a ground fault test sequence in response to actuation of the button. The test unit is also structured to output a momentary alarm signal if the GFCI fails the GFCI self-test sequence.

In accordance with aspects of the disclosed concept, a GFCI comprises: a line conductor; a neutral conductor; separable contacts structured to open to interrupt current flowing through the line and neutral conductors; aground fault detection circuit structured to detect a ground fault based on current flowing through the line and neutral conductors and to output a trip signal in response to detecting the ground fault; a trip circuit structured to trip open the separable contacts in response to the trip signal; a test button structured to be actuated by a user; a test unit structured to sequentially perform a GFCI self-test sequence and a ground fault test sequence in response to actuation of the test button, wherein the test unit is structured to determine whether the GFCI passed the GFCI self-test sequence and to output in an alarm signal in response to determining that the GFCI failed the GFCI self-test sequence; and an indicator structured to receive the alarm signal and to provide a visual or audible indication in response to receiving the alarm signal.

In accordance with other aspects of the disclosed concept, a method of testing a GFCI comprises: sensing actuation of a button on the GFCI; performing a GFCI self-test sequence in response to actuation of the button; determining whether the GFCI passed the GFCI self-test sequence and, in response to determining that the GFCI failed the GFCI self-test sequence, momentarily outputting an alarm signal; providing an audible or visual indication in response to outputting the alarm signal; and performing a ground fault test after performing the GFCI self-test sequence.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
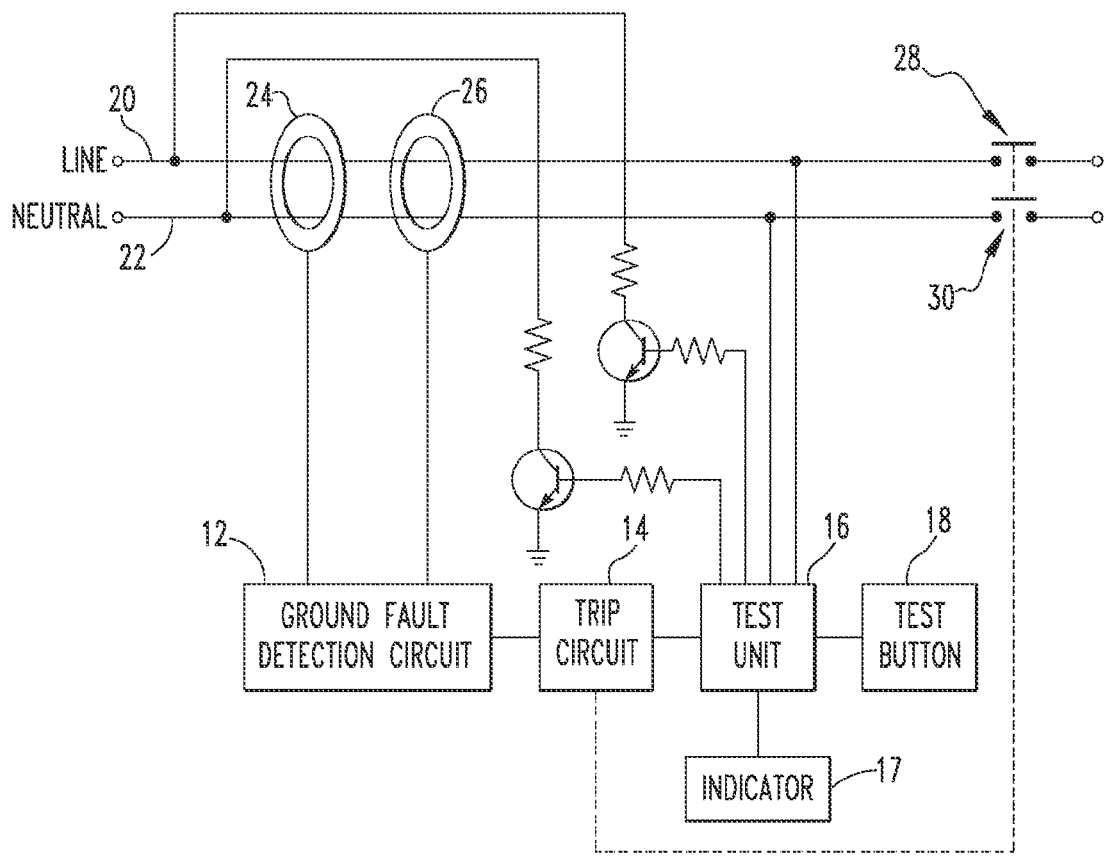
FIG. 1 is a schematic diagram of a ground fault circuit interrupter (GFCI) in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "processor" shall mean a programmable analog and/or digital device that can store, retrieve and process data; a controller; a control circuit; a computer; a workstation; a personal computer; a microprocessor; a microcontroller; a microcomputer; a central processing unit; a mainframe computer; a mini-computer; a server; a networked processor; or any suitable processing device or apparatus.

FIG. 1 is a schematic diagram of a ground fault circuit interrupter (GFCI) 1 in accordance with an example embodiment of the disclosed concept. The GFCI 1 includes a ground fault detection circuit 12, a trip circuit 14, a test unit 16 and a test button 18. The GFCI also includes line and neutral conductors 20,22, current sensors 24,26 configured to sense current flowing through the line and neutral conductors and separable contacts 28,30 structured to trip open to interrupt current flowing through the line and neutral conductors 20,72.

The ground fault detection circuit 12 is structured to detect a ground fault based on outputs of the current sensors 24,26. Upon detecting a ground fault, the ground fault detection circuit 12 outputs a signal to the trip circuit 14 to cause the trip circuit 14 to trip open the separable contacts 28,30. The ground fault detection circuit 12 may include a processor. The processor may be, for example and without limitation, a microprocessor, a microcontroller, or some other suitable processing device or circuitry. In some example embodiments of the disclosed concept, the ground fault detection circuit 12 employs a USRV4145 chip manufactured by Fairchild Semiconductor having a place of business at San Jose, Calif.

The test unit 16 is configured to implement a GFCI self-test sequence and a ground fault test sequence. The test unit 16 may include a processor and/or circuitry arranged to implement the GFCI self-test sequence and the ground fault test sequence. The processor may be, for example and without limitation, a microprocessor, a microcontroller, or some other suitable processing device or circuitry.

The test button 18 is a button that may be actuated by a user. The test button 18 is electrically connected to the test unit 16 and, upon actuation of the test button 18, outputs a signal to the test unit 16. The test unit 16 senses that the test button 18 has been actuated based on the signal output by the test button 18. In response to receiving the signal from the test button 18, the test unit 16 initiates the GFCI self-test sequence and, upon completion of the GFCI self-test sequence, implements the ground fault test sequence. The test unit 16 also determines whether the GFCI 1 has passed the GFCI self-test. If the test unit 16 determines that the GFCI 1 has failed the GFCI self-test, the test unit 16 outputs a momentary alarm signal (e.g., without limitation, an end of life (EOL) alarm).

The GFCI 1 also includes an indicator 17. The indicator 17 may be an audible indicator such as, without limitation, a speaker, or a visual indicator such as, without limitation, a light. The indicator 17 provides an audible or visual indication in response to receiving the momentary alarm signal from the test unit 16. A user can then tell that the GFCI self-test sequence has failed by observing the indicator 17.

In addition to performing the GFCI self-test sequence in response to receiving the signal from the test button 18, the test unit 16 may also perform the GFCI self-test sequence upon power-up of the GFCI 1 or at predetermined time intervals.

Figure 2A:
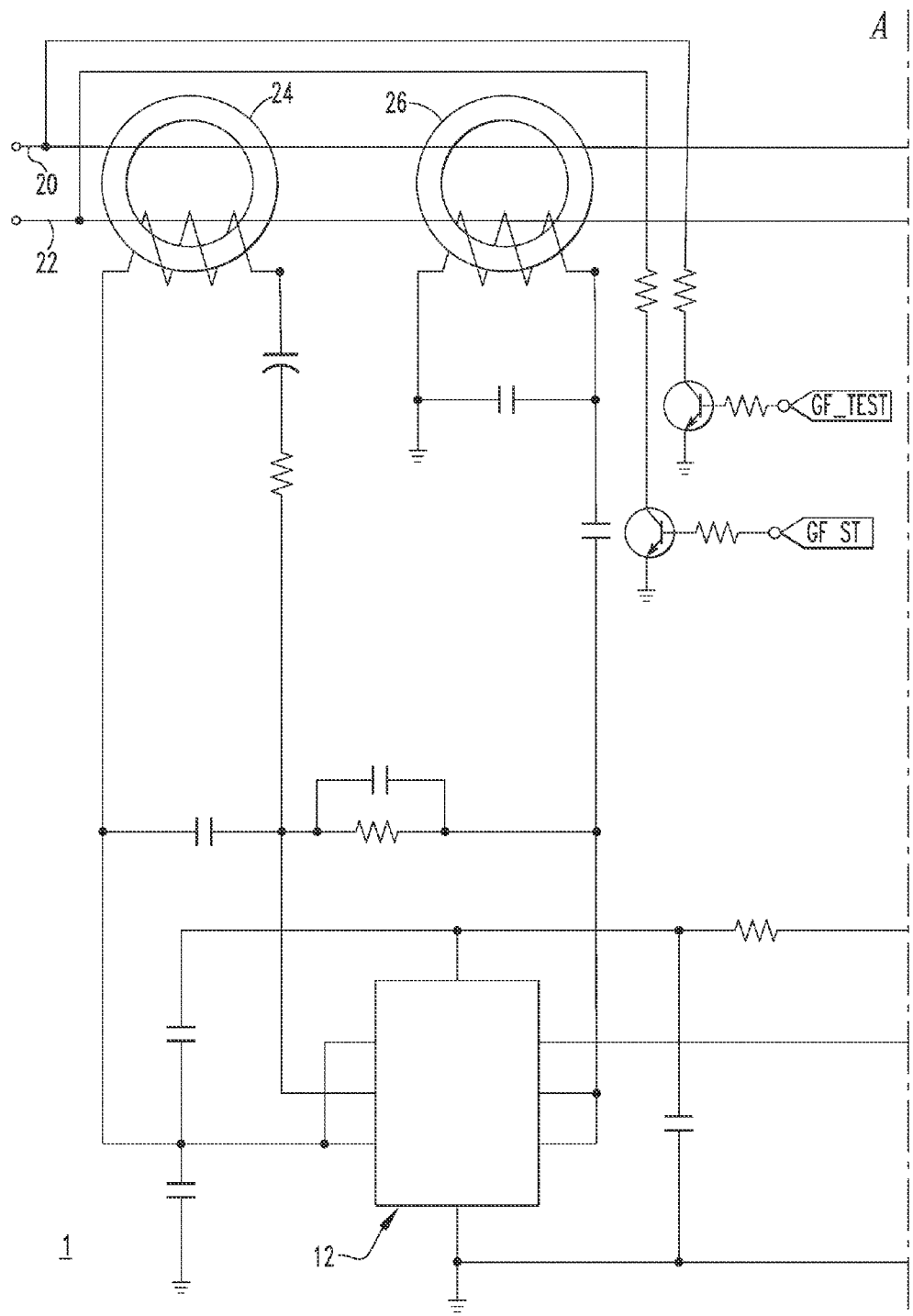
FIGS. 2A, 2B and 2C are a circuit diagram of the GFCI of FIG. 1.
Figure 2B:
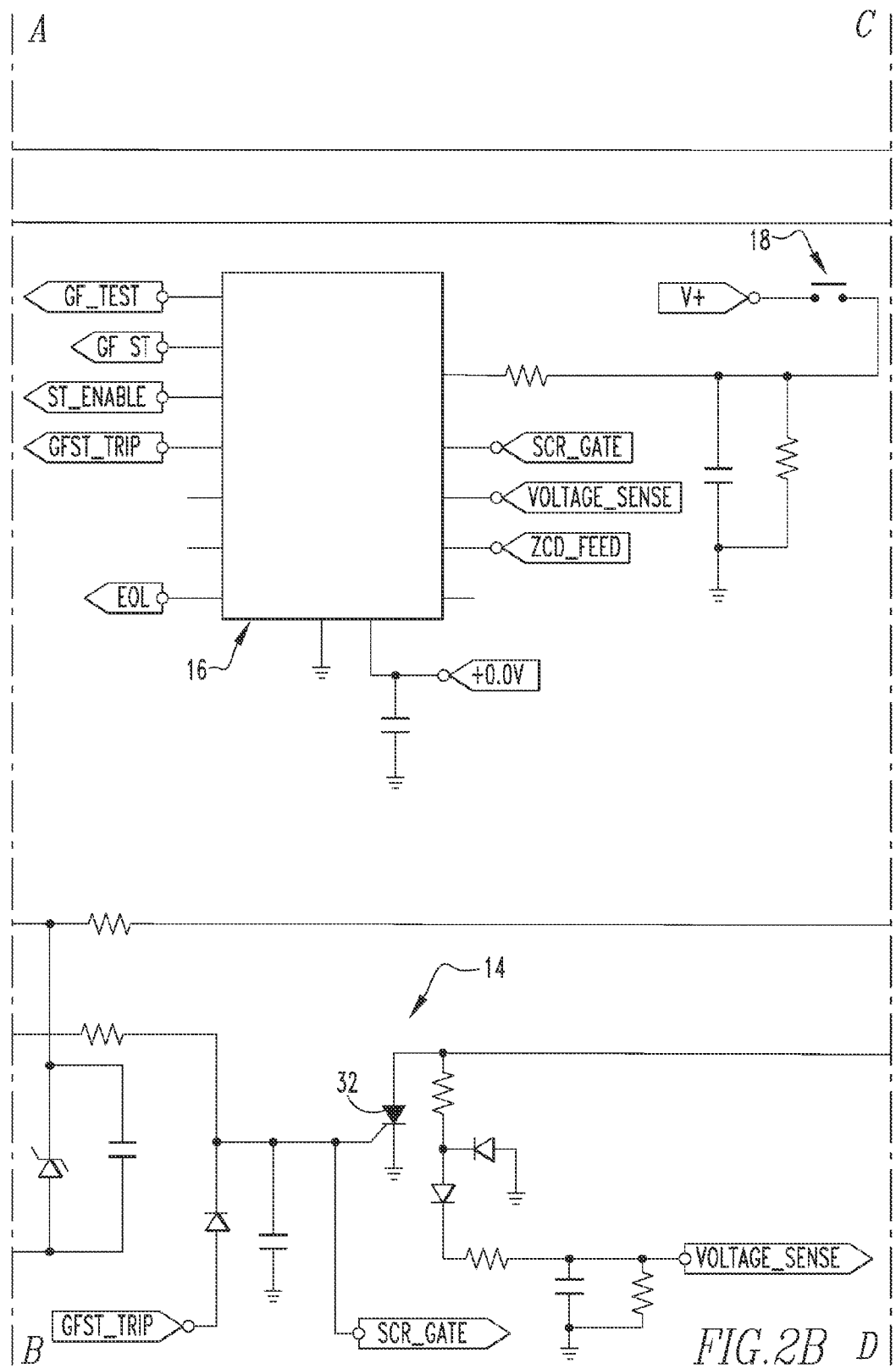
Figure 2C:
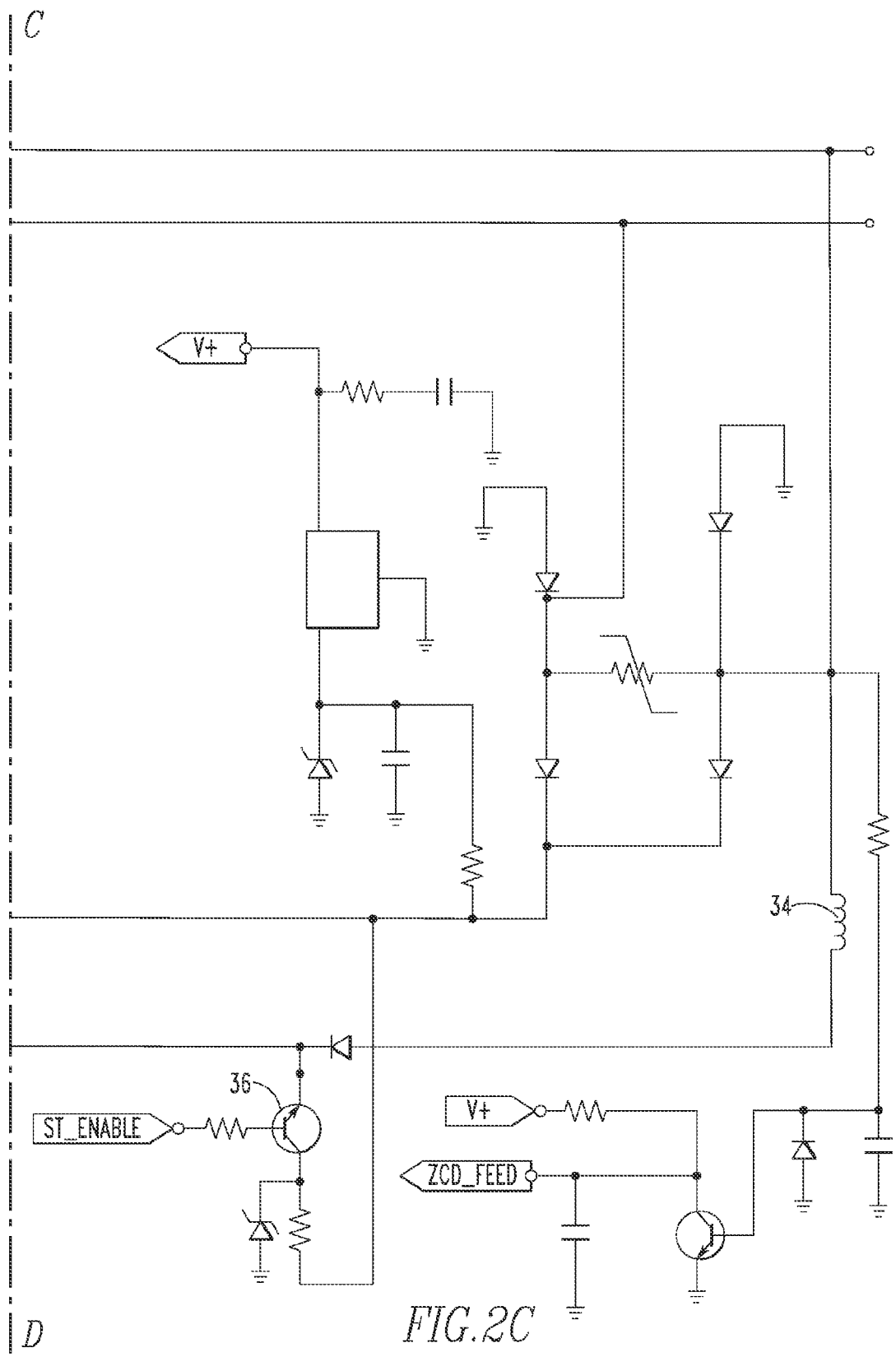

FIGS. 2A, 2B and 2C are a circuit diagram of the GFCI 1 of FIG. 1, showing circuit components of the GFCI 1 in more detail in FIGS. 2A, 2B and 2C. As shown, the trip circuit 14 includes a silicon controlled rectifier (SCR) 32 and a trip coil 34. Applying a signal to the gate of the SCR 32 pulls the anode of the SCR 32 to ground, thus allowing a current to flow through the trip coil 34. Current flowing through the trip coil 34 causes a solenoid (not shown) or other such device to open the separable contacts 28,30 (not shown in FIG. 2A, 2B or 2C). Also shown is a transistor 36 that is included in the test unit 16.

Figure 3:
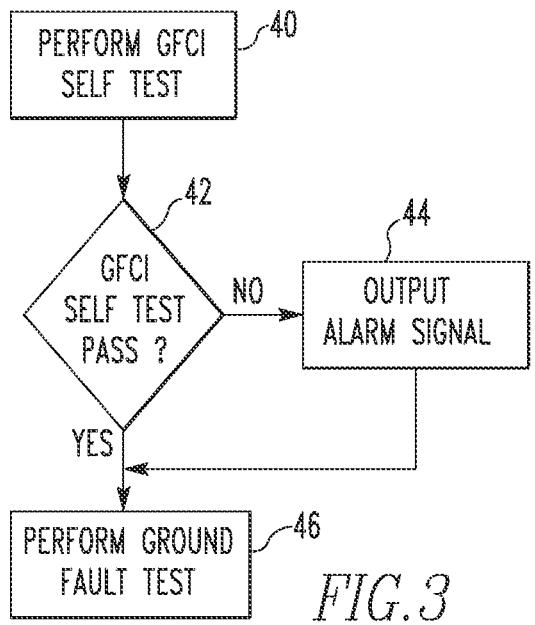
FIG. 3 is a flowchart of a method of testing a GFCI in accordance with an example embodiment of the disclosed concept.

FIG. 3 is a flowchart of a method of testing the GFCI 1. The method may be implemented by the test unit 16. The method of FIG. 3 begins in response to a user pressing the test button 18, which in turn outputs a signal to the test unit 16. At 40, the test unit 16 performs the GFCI self-test sequence. The GFCI self-test sequence will be described in more detail with respect to FIGS. 4-7. At 42, the test unit 16 determines whether the GFCI 1 passed or failed the GFCI self-test sequence. If the GFCI 1 failed the GFCI self-test sequence, the test unit 16 outputs an alarm signal. The indicator 17 outputs a visible or audible indication in response to the alarm signal. The alarm signal is a momentary alarm signal, meaning that it lasts a limited amount of time. In one example embodiment of the disclosed concept, the test unit 16 outputs the alarm signal for about 400 ms. After outputting the alarm signal or after determining that the GFCI 1 passed the GFCI self-test sequence, the test unit 16 performs the ground fault test at 46. During the ground fault test sequence, the test unit 16 simulates a ground fault. If the GFCI 1 is operating properly, the ground fault detection circuit 12 detects the ground fault and outputs a signal to the trip circuit 14 to cause the trip circuit 14 to trip open the separable contacts 28,30.

Figure 4:
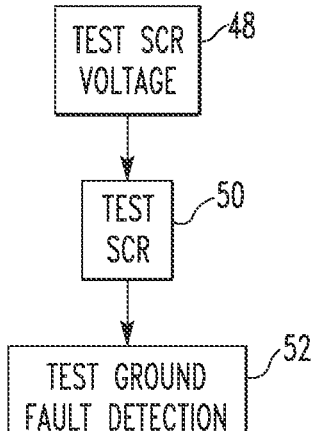
FIG. 4 is a flowchart of a method of performing a GFCI self-test sequence in accordance with an example embodiment of the disclosed concept.

Referring to FIG. 4, a flowchart of a method of performing the GFCI self-test sequence performed by the test unit 16 is shown. The GFCI self-test sequence includes three test portions, an SCR voltage test portion, an SCR test portion, and a ground fault detection test portion. At 48, the voltage at the anode of the SCR 32 is tested. This test ensures that the voltage at the anode of the SCR 32 is high enough so that when the SCR 32 is turned on enough current will flow through the trip coil 34 to trip open the separable contacts 28,30. At 50, the SCR 32 is tested. This test ensures that a small signal is received at the SCR 32 anode. At 52, the ground fault detection circuit 12 is tested. This test ensures that the ground fault detection circuit 12 properly detect a ground fault. This test also ensures that the SCR 32 turns on in response to the ground fault detection circuit 12 detecting a ground fault. The three test portions of the GFCI self-test sequence will be described in more detail hereinafter with respect to FIGS. 5-7.

Figure 5:
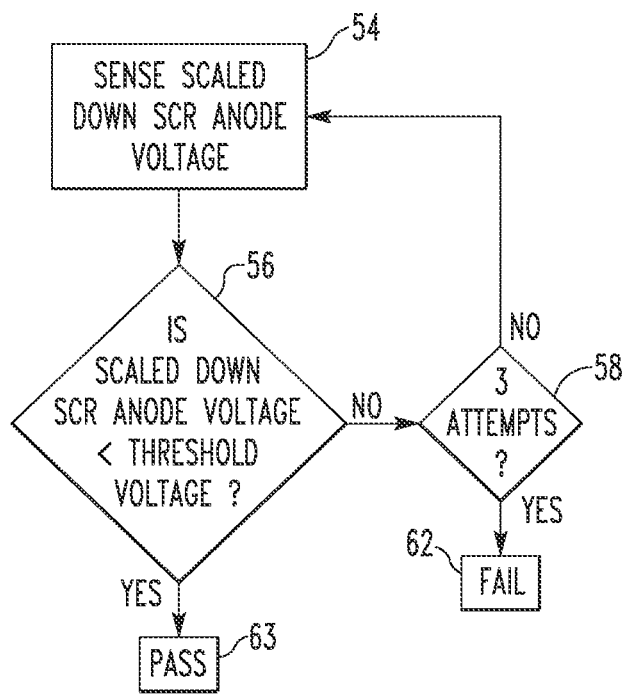
FIG. 5 is a flowchart of a method of performing a silicon controlled rectifier (SCR) voltage test portion in accordance with an example embodiment of the disclosed concept.

FIG. 5 is a flowchart of a method of performing the SCR voltage test portion of the GFCI self-test sequence. At 54, the test unit 16 senses the voltage of the anode of the SCR 32. In more detail, the test unit 16 senses a scaled down voltage of the anode of the SCR 32 at the VOLTAGE_SENSE pin of the test unit 16. At 56, the test unit 16 compares the scaled down voltage to a preset threshold voltage. If the scaled down voltage is greater than the preset threshold voltage, the test unit 16 determines that the GFCI 1 has passed this portion of the self-test sequence at 63. On the other hand, if the scaled down voltage is less than the preset threshold voltage, the test unit 16 moves to 58 and re-attempts to sense the voltage of the anode of the SCR 32 and compare the scaled down voltage to the preset threshold voltage. If the scaled down voltage remains below the preset threshold voltage after three attempts, the test unit 16 determines that the GFCI 1 has failed this portion of the GFCI self-test sequence at 62. If the test unit 16 determines that the GFCI 1 has passed this portion of the GFCI self-test sequence at 63, the test unit 16 proceeds with the next portion of the GFCI self-test sequence at 50 (FIG. 4). However, if the test unit 16 determines that the GFCI 1 has failed this portion of the GFCI self-test sequence at 62, the test unit 16 proceeds to output the alarm signal at 44 (FIG. 3) and then perform the ground fault test at 46 (FIG. 3).

The SCR voltage test portion of the GFCI self-test sequence is performed during half cycles where the voltage of the line conductor 20 is greater than the voltage of the neutral conductor 22. While the method disclosed in FIG. 5 re-attempts to sense the voltage of the anode of the SCR 32 three times before determining that the portion of the test has been failed, it will be appreciated that the test unit 16 may determine that the portion of the test has been failed without re-attempting to sense the voltage of the anode of the SCR 32. It will also be appreciated that the test unit 16 may re-attempt to sense the voltage at the anode of the SCR 32 any number of times before determining that the portion of the test has been failed.

Figure 6:
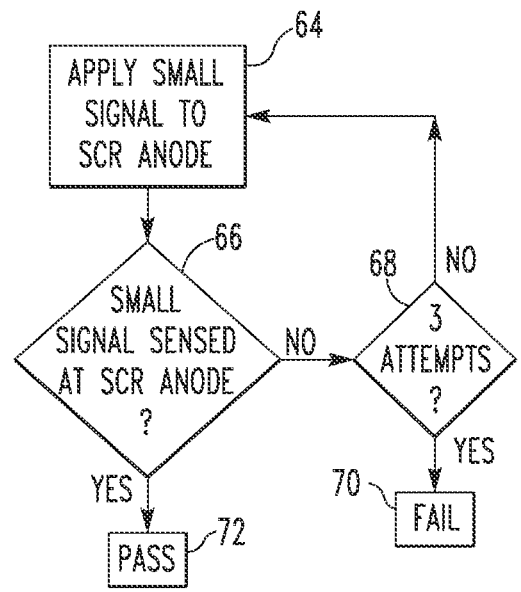
FIG. 6 is a flowchart of a method of performing an SCR test portion in accordance with an example embodiment of the disclosed concept.

FIG. 6 is a flowchart of a method of performing the SCR test portion of the GFCI self-test sequence. At 64, the test unit 16 applies a small signal to the anode of the SCR 32. In more detail, the test unit 16 turns on its ST_ENABLE pin for a predetermined period of time (e.g., without limitation, 4 ms). This turns on the transistor 36 causes a small signal to be put on the anode of the SCR 32. At 66, the test unit 16 senses whether the small signal is on the anode of the SCR 32. In more detail, the test unit 16 senses the voltage of the anode of the SCR 32 via its VOLTAGE_SENSE pin and determines whether the small signal is present at the anode of the SCR 32.

If the test unit 16 determines that the small signal is present at the anode of the SCR 32, the test unit 16 proceeds to 72 and determines that this portion of the GFCI self-test sequence has been passed. On the other hand, if the test unit 16 does not sense the small signal at the anode of the SCR 32, the test unit proceeds to 68 and re-attempts to apply the small signal to the anode of the SCR 32 and to detect the small signal at the anode of the SCR 32. If the test unit 16 cannot detect the small signal at the anode of the SCR 32 after three attempts, the test unit 16 proceeds to 70 and determines that the GFCI 1 has failed this portion of the GFCI self-test sequence. If the test unit 16 determines that the GFCI 1 has passed this portion of the GFCI self-test sequence at 72, the test unit 16 proceeds with the next portion of the GFCI self-test sequence at 52 (FIG. 4). However, if the test unit 16 determines that the GFCI 1 has failed this portion of the GFCI self-test sequence at 70, the test unit 16 proceeds to output the alarm signal at 44 (FIG. 3) and then perform the ground fault test at 46 (FIG. 3).

The SCR test portion of the GFCI self-test sequence is performed during half cycles where the voltage of the neutral conductor 22 is greater than the voltage of the line conductor 20. While the routine disclosed in FIG. 6 re-attempts to apply the small signal to the anode of the SCR 32 and to detect the small signal at the anode of the SCR 32 three times before determining that the portion of the test has been failed, it will be appreciated that the test unit 16 may determine that the portion of the test has been failed without any re-attempting it. It will also be appreciated that the test unit 16 may re-attempt to apply the small signal to the anode of the SCR 32 and to detect the small signal at the anode of the SCR 32 any number of times before determining that the portion of the test has been failed.

Figure 7:
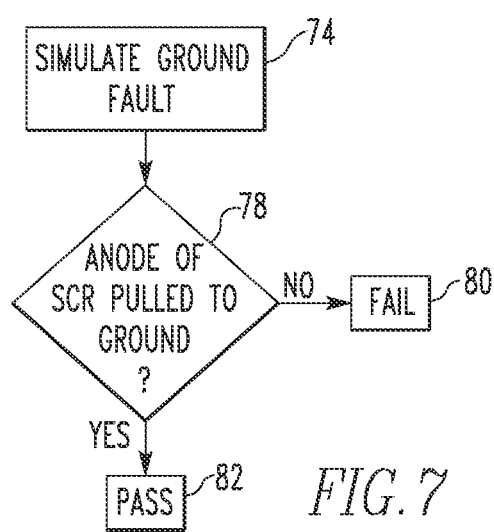
FIG. 7 is a flowchart of a method of performing a ground fault detection test portion in accordance with an example embodiment of the disclosed concept.

FIG. 7 is a flowchart of a method of performing the ground fault detection test portion of the GFCI self-test sequence. At 74, the test unit 16 simulates a ground fault. In more detail, the test unit 16 turns on its GFST pin for a predetermined period of time (e.g., without limitation 4 ms). This applies a fault current which should be detected by the ground fault detection circuit 12.

At 78, the test unit 16 determines if the anode of the SCR 32 has been pulled to ground. In more detail, the ground fault detection circuit 12, if operating properly, will detect the fault current and, in response, turn on the SCR 32. The test unit 16 senses the voltage of the anode of the SCR 32 via its VOLTAGE_SENSE pin and determines whether the voltage of the anode of the SCR 32 has been pulled to ground. If the test unit determines that the anode of the SCR 32 has been pulled to ground, it proceeds to 82 and determines that the GFCI 1 has passed this portion of the GFCI self-test sequence. On the other hand, if the test unit 16 determines that the anode of the SCR 32 has not been pulled to ground, the test unit 16 proceeds to 80 and determines that the GFCI 1 has failed this portion of the GFCI self-test sequence. If the test unit 16 determines that the GFCI 1 has passed this portion of the GFCI self-test sequence at 82, the test unit 16 proceeds to perform the ground fault test at 46 (FIG. 4). However, if the test unit 16 determines that the GFCI 1 has failed this portion of the GFCI self-test sequence at 80, the test unit 16 proceeds to output the alarm signal at 44 (FIG. 3) and then perform the ground fault test at 46 (FIG. 3).

The ground fault detection test portion of the GFCI self-test sequence is performed during a half cycle where the voltage of the neutral conductor 22 is greater than the voltage of the line conductor 20.

If any portions of the GFCI self-test sequence fail (i.e., the SCR voltage test portion, the SCR test portion, or the ground fault detection test portion), the test unit 16 determines that the GFCI 1 has failed the GFCI self-test and outputs the alarm signal (see step 44 in FIG. 3). If the GFCI 1 passes all of the portions of the GFCI self-test sequence, the test unit then proceeds to perform the ground fault test sequence (see step 46 in FIG. 3).

Referring back to FIG. 3, the test unit 16 performs the ground fault test sequence after it determines that the GFCI 1 has passed the GFCI self-test sequence or after outputting the alarm signal. In more detail, the test unit 16 turns on its GF_TEST pin which causes a fault current. If working properly, the ground fault detection circuit 12 will detect the ground fault and, in response, cause the trip circuit 14 to trip open the separable contacts 28,30. The trip coil 34 is not blocked during the ground fault test, so the separable contacts 28,30 will actually trip open during this test. The ground fault test sequence is performed during a half cycle when the voltage of the line conductor 20 is greater than the voltage of the neutral conductor 22.

By performing the GFCI self-test sequence in response to actuation of the test button 18, the GFCI 1 allows a user to manually initiate the GFCI self-test sequence, thus alleviating user concerns as to whether the GFCI self-test sequence is being periodically performed. Additionally, the GFCI 1 provides indication to the user when the GFCI self-test sequence has failed.

Although separable contacts 28,30 are disclosed herein, suitable solid state separable contacts can be employed. For example, a wide range of circuit interruption mechanisms (e.g., without limitation, solid state switches like FET or IGBT devices; contactor contacts) and/or solid state based control/protection devices (e.g., without limitation, drives; soft-starters; DC/DC converters) and/or operating mechanisms (e.g., without limitation, electrical, electro-mechanical, or mechanical mechanisms) may be employed without departing from the scope of the disclosed concept.

The disclosed concept can also be embodied as computer readable codes on a tangible, non-transitory computer readable recording medium. The computer readable recording medium is any data storage device that can store data which can be thereafter read by a computer system. Non-limiting examples of the computer readable recording medium include read-only memory (ROM), non-volatile random-access memory (RAM), CD-ROMs, magnetic tapes, floppy disks, disk storage devices, and optical data storage devices.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A ground fault circuit interrupter (GFCI) comprising:
a line conductor;
a neutral conductor;
separable contacts structured to open to interrupt current flowing through the line and neutral conductors;
a ground fault detection circuit structured to detect a ground fault based on current flowing through the line and neutral conductors and to output a trip signal in response to detecting the ground fault;
a trip circuit structured to trip open the separable contacts in response to the trip signal;
a test button structured to be actuated by a user;
a test unit structured to sequentially perform a GFCI self-test sequence and a ground fault test sequence in response to actuation of the test button, wherein the test unit is structured to determine whether the GFCI passed the GFCI self-test sequence and to output in an alarm signal in response to determining that the GFCI failed the GFCI self-test sequence; and
an indicator structured to receive the alarm signal and to provide a visual or audible indication in response to receiving the alarm signal,
wherein the trip circuit includes a silicon controlled rectifier (SCR) and a trip coil,
wherein the GFCI self-test sequence includes an SCR voltage test portion, an SCR test portion, and a ground fault detection test portion, and
wherein the test unit is structured to determine that the GFCI failed the GFCI self-test sequence if the GFCI fails any of the SCR voltage test portion, the SCR test portion, and the ground fault detection test portion.

2. The GFCI of claim 1, wherein the test unit is structured to sense a scaled down voltage of an anode of the SCR and to determine whether the scaled down voltage is less than a preset threshold voltage during the SCR voltage test portion; and wherein the test unit is structured to determine that the GFCI failed the SCR voltage test portion if the scaled down voltage is less than the preset threshold voltage.

3. The GFCI of claim 2, wherein the test unit is structured to re-attempt to sense the scaled down voltage of the anode of the SCR and to determine whether the scaled down voltage is less than the preset threshold voltage a plurality of times before determining that the GFCI failed the SCR voltage test portion.

4. The GFCI of claim 1, wherein the test unit is structured to perform the SCR voltage test portion during a half cycle when a voltage of the line conductor is greater than a voltage of the neutral conductor.

5. The GFCI of claim 1, wherein the test unit is structured to apply a small signal to an anode of the SCR and to sense the small signal at the anode of the SCR during the SCR test portion, and
wherein the test unit is structured to determine that the GFCI failed the SCR test portion if the small signal is not detected at the anode of the SCR.

6. The GFCI of claim 5, wherein the test unit is structured to re-attempt to apply the small signal to an anode of the SCR and to sense the small signal at the anode of the SCR a plurality of times before determining that the GFCI failed the SCR test portion.

7. The GFCI of claim 5, wherein the test unit is structured to perform the SCR test portion during a half cycle when a voltage of the line conductor is less than a voltage of the neutral conductor.

8. The GFCI of claim 1, wherein the test unit is structured to simulate a ground fault current in the GFCI during the ground fault detection test portion, and
wherein the test unit is structured to determine whether an anode of the SCR is pulled to ground during the ground fault detection test portion and to determine that the GFCI failed the ground fault detection test portion in response to determining that the anode of the SCR has not been pulled to ground during the ground fault detection test portion.

9. The GFCI of claim 8, wherein the test unit is structured to perform the ground fault detection test portion during a half cycle when a voltage of the line conductor is less than a voltage of the neutral conductor.

10. The GFCI of claim 8, wherein the ground fault detection circuit is structured to detect the ground fault current during the ground fault detection test portion and to output the trip signal to a gate of the SCR; and wherein the SCR is structured to electrically connect its anode to ground in response to receiving the trip signal.

11. The GFCI of claim 1, wherein the test unit is structured to simulate a ground fault current in the GFCI during the ground fault test sequence; wherein the ground fault detection circuit is structured to detect the ground fault current during the ground fault test sequence and to output the trip signal in response to detecting the ground fault current; and wherein the trip circuit is structured to trip open the separable contacts in response to receiving the trip signal during the ground fault test.

12. A method of testing a ground fault circuit interrupter (GFCI), the method comprising:
sensing actuation of a button on the GFCI;
performing a GFCI self-test sequence in response to actuation of the button;
determining whether the GFCI passed the GFCI self-test sequence and, in response to determining that the GFCI failed the GFCI self-test sequence, momentarily outputting an alarm signal;

providing an audible or visual indication in response to outputting the alarm signal; and performing a ground fault test after performing the GFCI self-test sequence, wherein the GFCI includes a trip circuit including a silicon controlled rectifier (SCR) and a trip coil, wherein performing the GFCI self-test sequence further comprises:

performing an SCR voltage test portion;

performing an SCR test portion; and performing a ground fault detection test portion, and wherein determining whether the GFCI passed the GFCI self-test sequence further comprises:

determining that the GFCI failed the GFCI self-test sequence if the GFCI failed any of the SCR voltage test portion, the SCR test portion and the ground fault detection test portion.

13. The method of claim 12, wherein performing the SCR voltage test portion comprises:

sensing a scaled down voltage of an anode of the SCR;

comparing the scaled down voltage to a preset threshold voltage; and determining that the GFCI failed the SCR voltage test portion when the scaled down voltage is less than the preset threshold voltage.

14. The method of claim 12, wherein performing the SCR test portion comprises:

applying a small signal to an anode of the SCR;

sensing the small signal at the anode of the SCR; and determining that the GFCI failed the SCR test portion when the small signal cannot be sensed at the anode of the SCR.

15. The method of claim 12, wherein performing the ground fault detection test portion comprises:

simulating a ground fault current in the GFCI;

sensing whether an anode of the SCR has been pulled to ground; and determining that the GFCI failed the ground fault detection test portion if the anode of the SCR has not been pulled to ground.

16. The method of claim 12, wherein performing the ground fault test sequence comprises:

simulating a ground fault current in the GFCI;

detecting the ground fault current; and tripping open separable contact included in the GFCI in response to detecting the ground fault current.

\* \* \* \* \*